United States Patent
Iizuka et al.

(10) Patent No.: US 10,996,198 B2
(45) Date of Patent: May 4, 2021

(54) INTEGRATED CIRCUIT SENSOR AND SENSOR SUBSTRATE

(71) Applicant: SHARP KABUSHIKI KAISHA, Sakai (JP)

(72) Inventors: Kunihiko Iizuka, Sakai (JP); Akira Saito, Sakai (JP); Takeshi Mitsunaka, Sakai (JP); Nobuyuki Ashida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 307 days.

(21) Appl. No.: 15/744,516

(22) PCT Filed: Jun. 10, 2016

(86) PCT No.: PCT/JP2016/067316
§ 371 (c)(1),
(2) Date: Jan. 12, 2018

(87) PCT Pub. No.: WO2017/038196
PCT Pub. Date: Mar. 9, 2017

(65) Prior Publication Data
US 2018/0209937 A1    Jul. 26, 2018

(30) Foreign Application Priority Data

Sep. 4, 2015   (JP) .............................. JP2015-175092

(51) Int. Cl.
*G01N 27/72*   (2006.01)
*H03B 5/12*    (2006.01)
(Continued)

(52) U.S. Cl.
CPC ............. *G01N 27/72* (2013.01); *G01N 27/22* (2013.01); *H01L 23/3121* (2013.01);
(Continued)

(58) Field of Classification Search
CPC ..... G01N 27/72; G01N 27/22; H01L 23/3185; H01L 23/4985; H01L 23/49838;
(Continued)

(56) References Cited

U.S. PATENT DOCUMENTS 10,055,631 B1 *  8/2018  Wen ..................... H01L 23/5389
2003/0161512 A1  8/2003  Mathiassen et al.
(Continued)

FOREIGN PATENT DOCUMENTS

JP      H10-062390 A    3/1998
JP      3326791 B2      9/2002
(Continued)

OTHER PUBLICATIONS

C. Sideris, A.Hajimin, "An Integrated magnetic Spectrometer for Multiplexed Biosensing", IEEE Solid-State Circuit Conf. Dig. Tech. papers, pp. 300-302, Feb. 2013.

*Primary Examiner* — Huy Q Phan
*Assistant Examiner* — Adam S Clarke
(74) *Attorney, Agent, or Firm* — ScienBiziP, P.C.

(57) ABSTRACT

An integrated circuit sensor that enables, regardless of a type of an inspection object, the inspection object and a front surface of the integrated circuit sensor to be in reliable contact with each other in a large region is provided. A through silicon via (11) that electrically connects an inside of an integrated circuit sensor (4) and an outside of the integrated circuit sensor (4) is formed in the inside of the integrated circuit sensor (4) so as to reach a rear surface of the integrated circuit sensor (4), which faces the front surface of the integrated circuit sensor (4).

7 Claims, 13 Drawing Sheets

(51) Int. Cl.
*H01L 23/31* (2006.01)
*G01N 27/22* (2006.01)
*H01L 23/48* (2006.01)
*H01L 23/498* (2006.01)
*H01L 23/00* (2006.01)

(52) U.S. Cl.
CPC ........ *H01L 23/3185* (2013.01); *H01L 23/481* (2013.01); *H01L 23/4985* (2013.01); *H01L 23/49838* (2013.01); *H03B 5/1212* (2013.01); *H03B 5/1228* (2013.01); *H01L 24/13* (2013.01); *H01L 24/16* (2013.01); *H01L 2224/0401* (2013.01); *H01L 2224/04042* (2013.01); *H01L 2224/13025* (2013.01); *H01L 2224/16227* (2013.01); *H01L 2224/48091* (2013.01); *H01L 2224/8592* (2013.01); *H01L 2924/00014* (2013.01); *H01L 2924/14* (2013.01); *H01L 2924/19042* (2013.01); *H01L 2924/19107* (2013.01)

(58) Field of Classification Search
CPC ............... H01L 23/481; H01L 23/3121; H01L 2224/04042; H01L 2224/0401; H01L 2224/48091; H01L 2924/19107; H01L 2224/8592; H01L 2924/00014; H01L 2924/19042; H01L 2924/14; H01L 2224/16227; H01L 2224/13025; H01L 24/16; H01L 24/13; H03B 5/1212; H03B 5/1228

See application file for complete search history.

(56) References Cited

U.S. PATENT DOCUMENTS

| | | | |
|---|---|---|---|
| 2004/0188838 A1* | 9/2004 | Okada .................. | G06K 9/0002 257/738 |
| 2008/0002867 A1* | 1/2008 | Mathiassen .......... | G06K 9/0002 382/124 |
| 2010/0237992 A1* | 9/2010 | Liautaud .............. | G06K 9/0002 340/5.83 |
| 2012/0247955 A1 | 10/2012 | Yamanouchi et al. | |
| 2015/0016223 A1* | 1/2015 | Dickinson ............ | G01H 1/04 367/87 |
| 2017/0147851 A1* | 5/2017 | Wang ...................... | H01L 24/49 |
| 2017/0147852 A1* | 5/2017 | Benkley, III ........ | H01L 23/5387 |
| 2018/0247143 A1* | 8/2018 | Cho .................... | G06K 9/0004 |
| 2019/0311172 A1* | 10/2019 | Kang .................. | G06K 9/0002 |

FOREIGN PATENT DOCUMENTS

| | | |
|---|---|---|
| JP | 2003-536085 A | 12/2003 |
| JP | 2005-338980 A | 12/2005 |
| JP | 2009-080091 A | 4/2009 |
| JP | 2010-101864 A | 5/2010 |
| JP | 2012-215469 A | 11/2012 |

* cited by examiner

INTEGRATED CIRCUIT SENSOR AND SENSOR SUBSTRATE

TECHNICAL FIELD

The present invention relates to an integrated circuit sensor which detects, by making an inspection object contact with a front surface of the integrated circuit sensor, permittivity or magnetic permeability of the inspection object, or permittivity or magnetic permeability each of which changes as a property of the inspection object changes, a sensor substrate on which the integrated circuit sensor is mounted, and also relates to a sensor device which includes the sensor substrate.

BACKGROUND ART

An integrated circuit sensor that detects pH, permittivity, or magnetic permeability of an inspection object, which is made contact with a front surface of the integrated circuit sensor in which a sensor is formed in an integrated circuit, or detects a change thereof is proposed. In PTL 1, a technique of detecting pH distribution of an inspection object that is in contact with an integrated circuit sensor in which a plurality of sensors are formed in an integrated circuit is described. Meanwhile, in NPL 1, a technique of performing sensing by utilizing a change in an oscillation frequency, which is caused by a magnetic particle included in an inspection object which is in contact with a top of an integrated circuit sensor in which an oscillator is formed in an integrated circuit, is described.

CITATION LIST

Patent Literature

PTL 1: Japanese Unexamined Patent Application Publication No. 2010-101864 (published on May 6, 2010)

Non Patent Literature

NPL 1: C. Sideris, A. Hajimiri, "An Integrated magnetic Spectrometer for Multiplexed Biosensing", IEEE Solid-State Circuit Conf. Dig. Tech. papers, pp. 300-302, February 2013

SUMMARY OF INVENTION

Technical Problem

FIG. 12 is a view illustrating a schematic configuration of a conventional sensor substrate 101 in which an integrated circuit sensor 103 is mounted on a printed substrate 102.

As illustrated, the integrated circuit sensor 103 is formed by providing a plurality of oscillators 105 in a silicon substrate 104. In a case where inductors 107 each of which is a constituent of a resonator are arranged near a front surface of the integrated circuit sensor 103 and circuit elements 106 of the oscillators 105 are arranged inside the integrated circuit sensor 103, a resonance frequency changes due to permittivity of an inspection object 100 which is in contact with the front surface of the integrated circuit sensor 103, and a fluctuation of an oscillation frequency occurs. By measuring such a fluctuation of the oscillation frequency by a frequency readout circuit (not illustrated) that is formed inside or outside the integrated circuit sensor 103, it is possible to sense a change in a physical property of the inspection object 100.

Note that, on the front surface of the integrated circuit sensor 103, that is, a surface of a side on which the inductors 107 are arranged, a terminal unit 109 is exposed and a protective layer 108 is formed so as to cover the inductors 107.

The terminal unit 109 formed on the front surface of the integrated circuit sensor 103 and an electrode which is on the printed substrate 102 are wire-bonded with use of a wire 110, and resin 111 is used for protecting the terminal unit 109 formed on the front surface of the integrated circuit sensor 103, the wire 110, and the electrode on the printed substrate 102 and for fixing the integrated circuit sensor 103 onto the printed substrate 102.

As illustrated, a fixation/protective member formed of the resin 111 is formed also on the front surface of the integrated circuit sensor 103. In a case where such a fixation/protective member formed of the resin 111 is formed also on the front surface of the integrated circuit sensor 103, when the inspection object 100 is in contact with the front surface of the integrated circuit sensor 103, a problem as described below is caused.

For example, in a case where the inspection object 100 is a skin of a human body or a solid food, even when the inspection object 100 is flexible to some extent, it is difficult to be in contact with an entirety of the front surface of the integrated circuit sensor 103 (specifically, an entirety of a sensing area which is the front surface of the integrated circuit sensor 103, in which the inductors 107 are arranged). This is because it is difficult to prevent a gap from being formed between the inspection object 100 and a part of the front surface of the integrated circuit sensor 103, in which the inductors 107 are arranged, due to the fixation/protective member formed on the front surface of the integrated circuit sensor 103.

Such a problem is caused not only in one that uses an oscillator as a sensor, but is common also to a sensor that adopts a method of detecting a physical property of an inspection object by making the inspection object contact with a front surface of an integrated circuit sensor or placing the inspection object in an immediate vicinity of the front surface. This is because, even when the inspection object is desired to be placed in the immediate vicinity of the front surface, there is a place in which the inspection object is not able to be placed due to the fixation/protective member formed on the front surface of the integrated circuit sensor 103.

Moreover, it is needless to say that such a problem is caused not only in a case where the terminal unit 109 formed on the front surface of the integrated circuit sensor 103 and the electrode on the printed substrate 102 are wire-bonded with use of the wire 110 but also in a case of using joint means such as a bump.

In PTL 1 described above, a sensor substrate illustrated in FIG. 13 described below is proposed, as focusing on difficulty of making an inspection object contact with a sensing area, which is caused by a protective member of a bonding wire which serves as a spacer in a case where the inspection object is a solid such as a surface of a skin.

FIG. 13 is a view illustrating a schematic configuration of a sensor substrate 201 disclosed in PTL 1 described above.

As illustrated, in the sensor substrate 201, a printed substrate 202 in which an opening is provided is used, and a rear surface of the printed substrate 202 around the opening and an edge part of a front surface of an integrated circuit sensor 203 are connected by a thin joint member 204.

However, in such a sensor substrate 201, in a case where an inspection object 200 is a solid such as a surface of a skin, a part in which the inspection object 200 is in contact with the front surface of the integrated circuit sensor 203 is limited to a center part of the front surface of the integrated circuit sensor 203, so that it is difficult to perform sensing with high accuracy.

In addition, in NPL 1 described above, the difficulty of making an inspection object contact with a sensing area, which is caused by a protective member of a bonding wire which serves as a spacer in the case where the inspection object is a solid such as a surface of a skin, is not particularly focused on.

An object of the invention is to provide an integrated circuit sensor that enables, regardless of a type of an inspection object, the inspection object and a front surface of the integrated circuit sensor to be in reliable contact with each other in a large region, a sensor substrate that includes the integrated circuit sensor, and a sensor device that includes the sensor substrate.

Solution to Problem

In order to solve the aforementioned problems, an integrated circuit sensor of the invention is an integrated circuit sensor that detects a physical property of an inspection object by making the inspection object contact with a front surface or placing the inspection object in a vicinity of the front surface, in which a connection unit that electrically connects an inside of the integrated circuit sensor and an outside of the integrated circuit sensor is formed in the inside of the integrated circuit sensor so as to reach a rear surface of the integrated circuit sensor, which faces the front surface.

With the aforementioned configuration, since the connection unit that electrically connects the inside of the integrated circuit sensor and the outside of the integrated circuit sensor is formed in the inside of the integrated circuit sensor so as to reach the rear surface of the integrated circuit sensor, which faces the front surface, it is not necessary to electrically connect the inside of the integrated circuit sensor and the outside of the integrated circuit sensor by using the front surface of the integrated circuit sensor.

Accordingly, it is possible to realize an integrated circuit sensor that enables, regardless of a type of an inspection object, the inspection object and a front surface of the integrated circuit sensor to be in reliable contact with each other in a large region.

Advantageous Effects of Invention

According to an aspect of the invention, it is possible to realize an integrated circuit sensor that enables, regardless of a type of an inspection object, the inspection object and a front surface of the integrated circuit sensor to be in reliable contact with each other in a large region, a sensor substrate that includes the integrated circuit sensor, and a sensor device that includes the sensor substrate.

DESCRIPTION OF EMBODIMENTS

Hereinafter, embodiments of the invention will be described in detail. Note that, unless otherwise particularly specified, a configuration described in each of the embodiments does not intend to limit the scope of the invention only thereto, and is merely an explanatory example. Note that, in diagrams described below, the same reference signs are assigned to ones that have the same functions, and description thereof is not repeated.

Although description will be given in each of the embodiments of the invention below by taking, as an example, an integrated circuit sensor that includes an oscillator (oscillation unit) having a resonance circuit whose resonance frequency changes in accordance with a property of an inspection object, a type of the integrated circuit sensor is not limited thereto, and may be an ion sensor of a CCD type, an ISFET ion sensor, or the like, for example.

Moreover, the integrated circuit sensor may adopt a method of detecting a physical property of an inspection object by making the inspection object contact with a front surface of the integrated circuit sensor or a method of detecting a physical property of an inspection object by placing the inspection object in a vicinity of the front surface of the integrated circuit sensor.

The embodiments of the invention will be described as follows on the basis of FIG. 1 to FIG. 11.

Embodiment 1

Hereinafter, an embodiment of the invention will be described on the basis of FIG. 1 to FIG. 3.

(Sensor Substrate)

Figure 1:
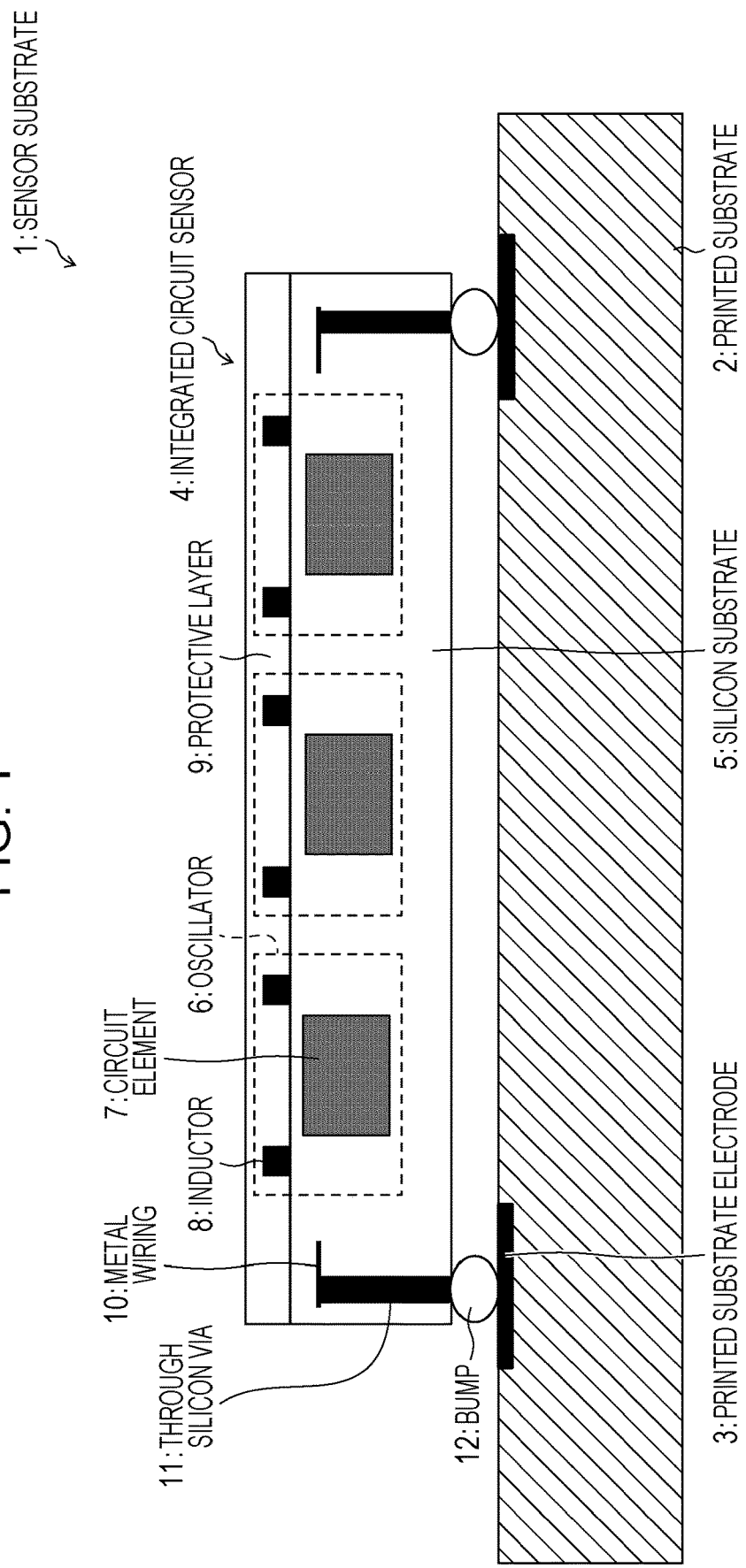
FIG. 1 is a view illustrating a schematic configuration of a sensor substrate according to Embodiment 1 of the invention, which includes an integrated circuit sensor.

FIG. 1 is a view illustrating a schematic configuration of a sensor substrate 1 which includes an integrated circuit sensor 4.

As illustrated, the sensor substrate 1 is provided with a printed substrate 2 and the integrated circuit sensor 4.

On a surface of the printed substrate 2, which faces the integrated circuit sensor 4, a printed substrate electrode 3 is provided. The printed substrate electrode 3 is connected to a wiring which is provided in the printed substrate 2 and is not illustrated.

The integrated circuit sensor 4 is formed by a semiconductor substrate, and formed by a silicon substrate 5 in the present embodiment.

The integrated circuit sensor 4 includes one or more oscillators 6 (oscillation units) each of which is provided with a resonator (resonance circuit) including an inductor 8 and a circuit element 7, and detects a change in a physical property of an inspection object which is in contact with the inductor 8 provided on a front surface of the integrated circuit sensor 4. Note that, the circuit element 7 is formed in an inside of the integrated circuit sensor 4.

A protective layer 9 is provided on an entirety of the front surface of the integrated circuit sensor 4 so as to cover the inductor 8.

The integrated circuit sensor 4 includes a through silicon via 11 (TSV (Through-Silicon via) electrode) serving as a connection unit that electrically connects a circuit (for example, the circuit element 7) in the inside of the integrated circuit sensor 4 and an outside (for example, the printed substrate electrode 3 of the printed substrate 2).

The through silicon via 11 is connected, in the inside of the integrated circuit sensor 4, to a metal wiring 10 connected to the circuit in the inside of the integrated circuit sensor 4, and is formed so as to reach a rear surface of the integrated circuit sensor 4 (surface of the integrated circuit sensor 4, which is opposite to the surface on which the protective layer 9 is formed).

Note that, although description has been given in the present embodiment by taking, as an example, a case where the connection unit is the through silicon via 11, there is no limitation thereto, and the connection unit may be, for example, a wiring electrically connected to the through silicon via 11.

In addition, as a connection fixation member, a bump 12 is formed between the through silicon via 11 exposed from the rear surface of the integrated circuit sensor 4 and the printed substrate electrode 3 of the printed substrate 2, and the circuit element 7 in the inside of the integrated circuit sensor 4 and the printed substrate electrode 3 of the printed substrate 2 in the outside of the integrated circuit sensor 4 are electrically connected via the metal wiring 10, the through silicon via 11, and the bump 12.

Although description has been given in the present embodiment by taking, as an example, a case where the through silicon via 11 and the printed substrate electrode 3 of the printed substrate 2 are electrically connected, there is no limitation thereto, and the through silicon via 11 may be electrically connected to a wiring of the printed substrate 2, which is not illustrated, without using the printed substrate electrode 3.

Note that, examples of a type of a signal transmitted from the outside of the integrated circuit sensor 4 to the circuit in the inside of the integrated circuit sensor 4 include, for example, a control signal and the like, and examples of a type of a signal transmitted from the circuit in the inside of the integrated circuit sensor 4 to the outside of the integrated circuit sensor 4 include, for example, an output signal of an oscillation frequency oscillated by the oscillator 6 and the like. In addition to the transmission of a signal, for example, it is necessary to connect the inside and the outside of the integrated circuit sensor 4 for supplying power and ground.

(Integrated Circuit Sensor)

Figure 2:
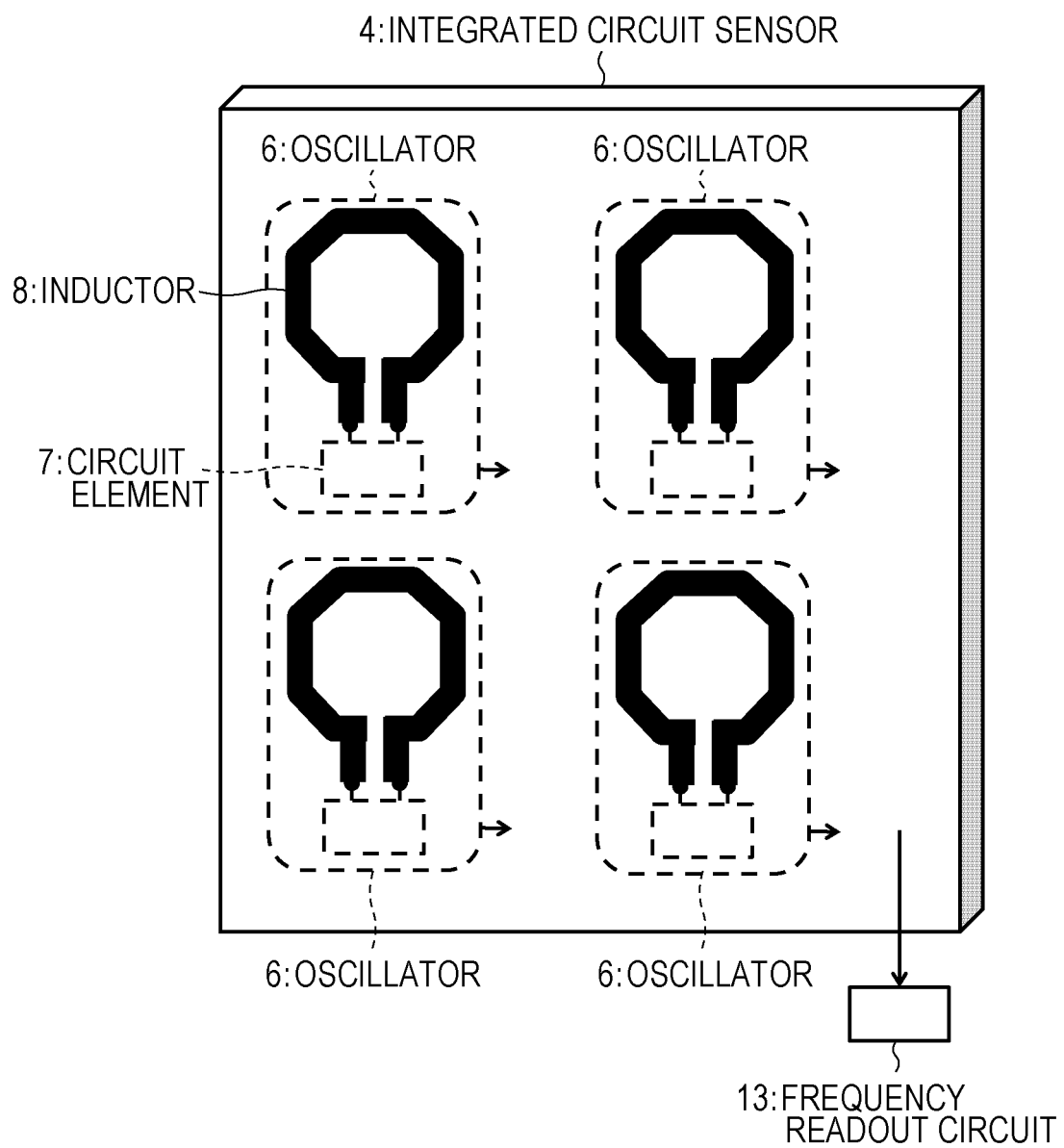
FIG. 2 is a view illustrating a schematic configuration of the integrated circuit sensor provided in the sensor substrate illustrated in FIG. 1.

FIG. 2 is a view illustrating a schematic configuration of the integrated circuit sensor 4 provided in the sensor substrate 1.

As illustrated, the integrated circuit sensor 4 includes one or more oscillators 6 (oscillation units) each of which is provided with the resonator (resonance circuit) including the inductor 8 and the circuit element 7. Note that, although a frequency readout circuit 13 that reads out the oscillation frequency oscillated by the oscillator 6 may be provided in the integrated circuit sensor 4 or in the outside of the integrated circuit sensor 4, description will be given in the present embodiment for a case where the frequency readout circuit 13 is provided in the outside of the integrated circuit sensor 4.

Though not illustrated, the integrated circuit sensor 4 may be provided with a frequency divider that divides the oscillation frequency oscillated by the oscillator 6 and outputs an output signal having the divided frequency to the frequency readout circuit 13.

(Oscillator)

Figure 3:
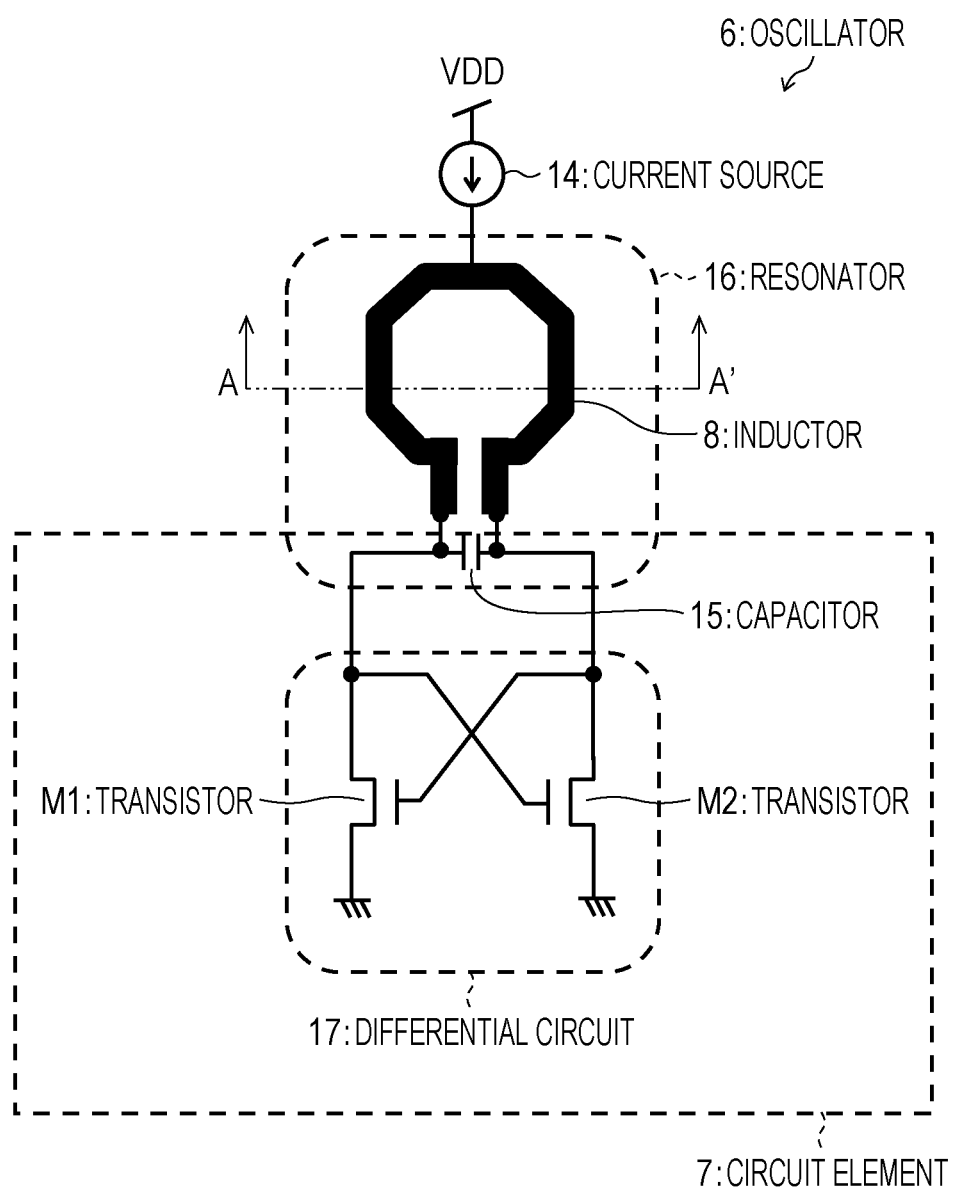
FIG. 3 is a circuit diagram of an oscillator provided in the integrated circuit sensor illustrated in FIG. 2.

FIG. 3 is a circuit diagram of the oscillator 6 provided in the integrated circuit sensor 4.

As illustrated, the oscillator 6 includes a differential circuit 17, a resonator 16 that is formed between differential outputs of the differential circuit 17, and a current source 14 that controls drive of the oscillator 6 in accordance with a control signal (enable, disable). The oscillator 6 has any resonance frequency of 30 to 200 GHz, for example. A frequency of 30 to 200 GHz is a frequency with which a change in complex permittivity of water is great and a change in frequency characteristics of permittivity is able to be detected with high sensitivity.

The differential circuit 17 includes an NMOS transistor M1 and an NMOS transistor M2 that are cross-coupled to each other. Note that, another differential circuit may be used as appropriate. For example, a bipolar transistor may be used.

The resonator 16 includes the inductor 8 and a capacitor 15 that are connected in parallel between the differential outputs of the differential circuit 17. Moreover, a resonance frequency with which the resonator 16 resonates is the oscillation frequency oscillated by the oscillator 6. Note that, the capacitor 15 may be formed by gate capacitances of the transistor M1 and the transistor M2, a parasitic capacitance of a non-illustrated wiring, or the like.

The inductor 8 and the capacitor 15 form an LC circuit, and the resonance frequency of the resonator 16 and the oscillation frequency of the oscillator 6 are defined by an inductance of the inductor 8 and a capacitance of the capacitor 15.

Note that, the inductor 8 in the resonator 16, which is in the oscillator 6 illustrated in FIG. 3, is formed near the front surface of the integrated circuit sensor 4 illustrated in FIG. 1, and the capacitor 15 in the resonator 16 and the differential circuit 17 are formed as the circuit element 7 in the integrated circuit sensor 4 illustrated in FIG. 1. The inductor 8 of the oscillator 6, which is illustrated in FIG. 1, is a cross sectional part of the inductor 8 of the oscillator 6 illustrated in FIG. 3, which is taken along an A-A' line.

According to the integrated circuit sensor 4, since the through silicon via 11 serving as the connection unit that electrically connects the inside of the integrated circuit sensor 4 and the outside of the integrated circuit sensor 4 is formed in the inside of the integrated circuit sensor 4 so as to reach the rear surface of the integrated circuit sensor 4, there is no necessity to electrically connect the inside of the integrated circuit sensor 4 and the outside of the integrated circuit sensor 4 by using the front surface of the integrated circuit sensor 4.

Accordingly, the front surface of the integrated circuit sensor 4, which is to be in contact with an inspection object, is maintained to be flat, and uniform contact with the inspection object is enabled in the entirety of the front surface of the integrated circuit sensor 4. Thus, it is possible to realize the integrated circuit sensor 4 that enables, regardless of a type of an inspection object, the inspection object and the front surface of the integrated circuit sensor 4 to be in reliable contact with each other in a large region.

Moreover, the sensor substrate 1 includes the integrated circuit sensor 4 and the printed substrate 2 which is provided with the printed substrate electrode 3 or a wiring, and the printed substrate electrode 3 or the wiring of the printed substrate 2 and the through silicon via 11 serving as the connection unit are electrically connected via the bump 12 serving as the connection fixation member, so that there is no necessity to electrically connect, by using the front surface of the integrated circuit sensor 4, the inside of the integrated circuit sensor 4 and the printed substrate electrode 3 or the wiring of the printed substrate 2 also in the sensor substrate 1 that includes the integrated circuit sensor 4 and the printed substrate 2 which is provided with the printed substrate electrode 3 or the wiring.

Accordingly, the front surface of the integrated circuit sensor 4, which is to be in contact with an inspection object, is maintained to be flat, and uniform contact with the inspection object is enabled in the entirety of the front surface of the integrated circuit sensor 4. Thus, it is possible to realize the sensor substrate 1 that enables, regardless of a type of an inspection object, the inspection object and the front surface of the integrated circuit sensor 4 to be in reliable contact with each other in a large region.

Embodiment 2

Next, Embodiment 2 of the invention will be described on the basis of FIG. 4. A sensor substrate 21 in the present embodiment is different from that of Embodiment 1 in that a printed substrate 22 serving as a slave substrate is inserted between the integrated circuit sensor 4 and a printed substrate 24 serving as a master substrate, and the other points are the same as what is described in Embodiment 1. For convenience of description, the same reference signs are assigned to members having the same functions as those of the members illustrated in the drawings of Embodiment 1, and description thereof is omitted.

Figure 4:
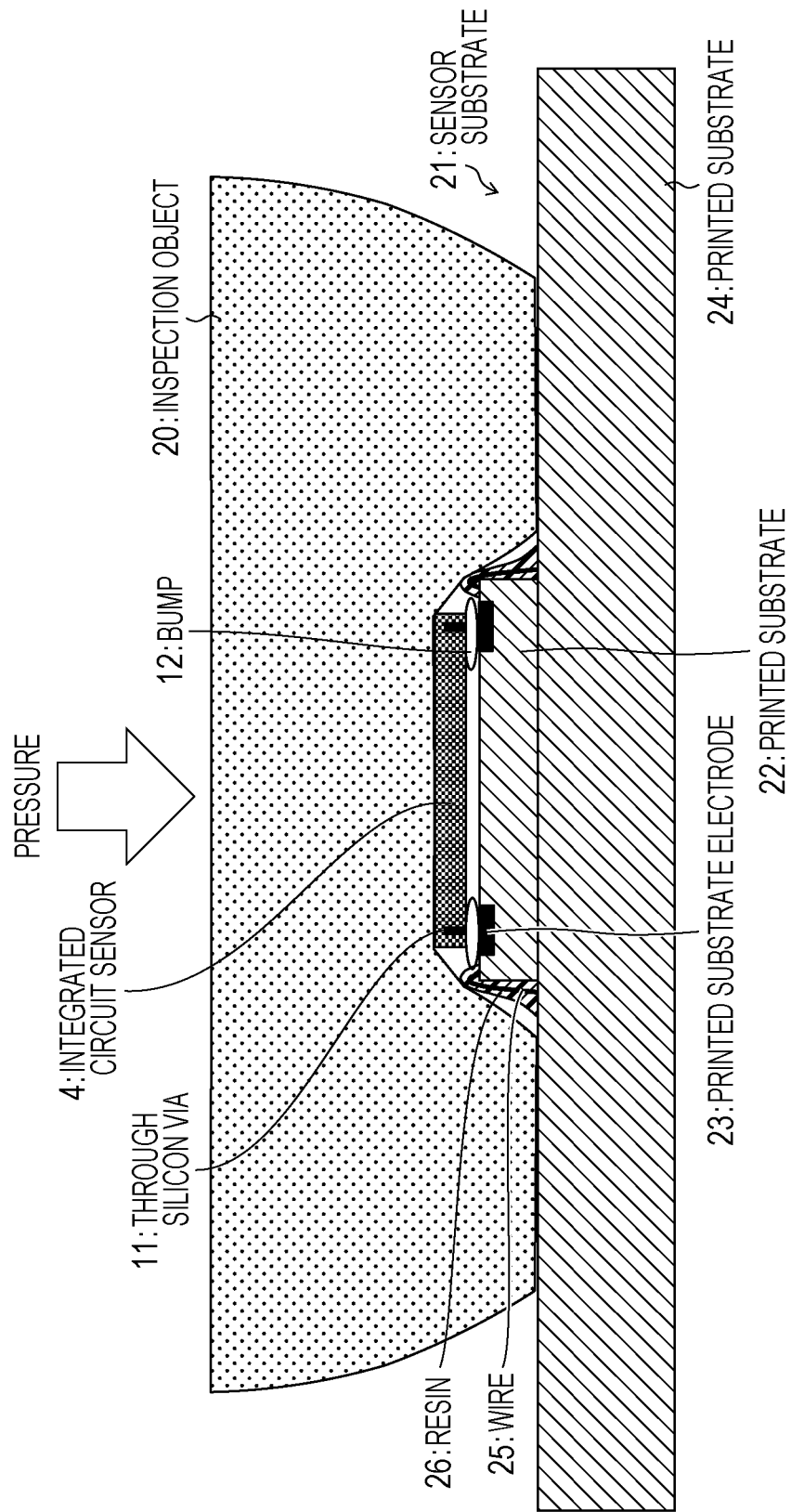
FIG. 4 is a view illustrating a schematic configuration of a sensor substrate according to Embodiment 2 of the invention.

FIG. 4 is a view illustrating a schematic configuration of the sensor substrate 21 that includes the integrated circuit sensor 4, the printed substrate 22 serving as the slave substrate, and the printed substrate 24 serving as the master substrate.

As illustrated, the through silicon via 11 in the integrated circuit sensor 4 and a printed substrate electrode 23 formed in the printed substrate 22 serving as the slave substrate are electrically connected via the bump 12.

A wiring (not illustrated) electrically connected to the printed substrate electrode 23 formed in the printed substrate 22 and a wiring (not illustrated) formed in the printed substrate 24 are electrically connected via a wire 25.

Resin 26 is used as a fixation member for protecting the wire 25 and fixing the printed substrate 22 onto the printed substrate 24.

Note that, although description has been given in the present embodiment by taking, as an example, a case where the connection is performed by using the wire 25 as described above, there is no limitation thereto, and the connection may be performed by using a bump or a connector without using the wire 25.

The printed substrate 22 that is inserted between the integrated circuit sensor 4 and the printed substrate 24 serving as the master substrate and serves as the slave substrate has a function of adjusting a difference in heights of the front surface of the integrated circuit sensor 4 and a front surface of the printed substrate 24 serving as the master substrate, and, when the inspection object 20 such as a skin, which is flexible, is pressed against the printed substrate 24, the inspection object 20 is bent by an amount of the difference in the heights of the front surface of the printed substrate 24 and the front surface of the integrated circuit sensor 4, and contact pressure of the inspection object 20 and the front surface of the integrated circuit sensor 4 is thereby controlled.

Therefore, by appropriately selecting a thickness of the printed substrate 22 serving as the slave substrate, it is possible to appropriately adjust the contact pressure of the inspection object 20 and the front surface of the integrated circuit sensor 4 in the sensor substrate 21.

Note that, in the present embodiment, a size of the printed substrate 22 is smaller than a size of the printed substrate 24 and slightly larger than a size of the integrated circuit sensor 4 so that, in a case where the inspection object 20 is pressed in a direction of the printed substrate 24, the inspection object 20 is in contact with the front surface of the integrated circuit sensor 4 and the printed substrate 24.

Although description has been given in the present embodiment by taking, as an example, a case where the printed substrate is used as the master substrate in order to electrically connect the master substrate and the slave substrate, in a case where there is no necessity to electrically connect the master substrate and the slave substrate, the printed substrate is not required to be used as the master substrate, and a resin substrate, a glass substrate, or the like may be used.

Embodiment 3

Next, Embodiment 3 of the invention will be described on the basis of FIG. 5 to FIG. 8. Each of sensor substrates 31, 41, 51, and 61 of the present embodiment is different from those of Embodiments 1 and 2 in that a spacer 32 or 33 that adjusts pressure with which the inspection object 20 is in contact with the front surface of the integrated circuit sensor 4 is provided, and the other points are the same as what is described in Embodiments 1 and 2. For convenience of description, the same reference signs are assigned to members having the same functions as those of the members illustrated in the drawings of Embodiments 1 and 2, and description thereof is omitted.

Figure 5:
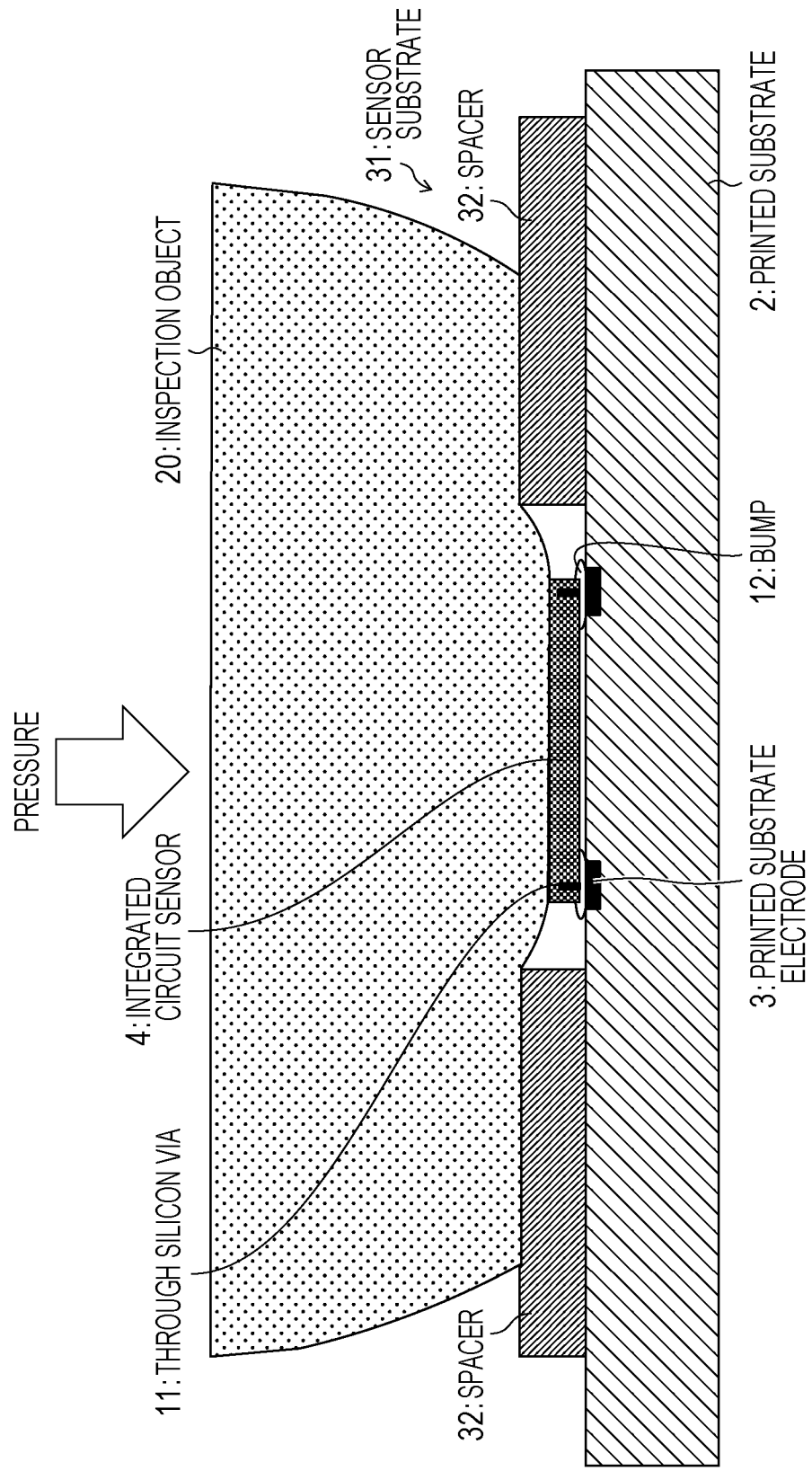
FIG. 5 is a view illustrating a schematic configuration of a sensor substrate according to Embodiment 3 of the invention, which includes a spacer a height of which is higher than that of a front surface of an integrated circuit sensor.

FIG. 5 is a view illustrating a schematic configuration of the sensor substrate 31 that includes the spacer 32 a height of which is higher than that of the front surface of the integrated circuit sensor 4.

The sensor substrate 31 illustrated in FIG. 5 is different from the sensor substrate 1 illustrated in FIG. 1 in that the spacer 32 is provided.

As illustrated, the spacer 32 that adjusts the pressure with which, when the inspection object 20 is pressed against the printed substrate 2, the inspection object 20 is in contact with the integrated circuit sensor 4 is provided around the integrated circuit sensor 4 on the printed substrate 2 in the sensor substrate 31.

In the present embodiment, the spacer 32 that adjusts the pressure with which the inspection object 20 is in contact with the integrated circuit sensor 4 is provided so as to have a thickness by which the height thereof becomes higher than that of the front surface of the integrated circuit sensor 4, but is not limited thereto and may be provided so as to have a thickness by which the height thereof becomes almost the same as that of the front surface of the integrated circuit sensor 4.

When such a spacer 32 is provided, it is possible to realize the sensor substrate 31 that is able to receive a part of the pressure by the spacer 32 so that, in a case where the inspection object 20 is pressed against the integrated circuit sensor 4, excessive pressure is not to be applied to the integrated circuit sensor 4.

Figure 6:
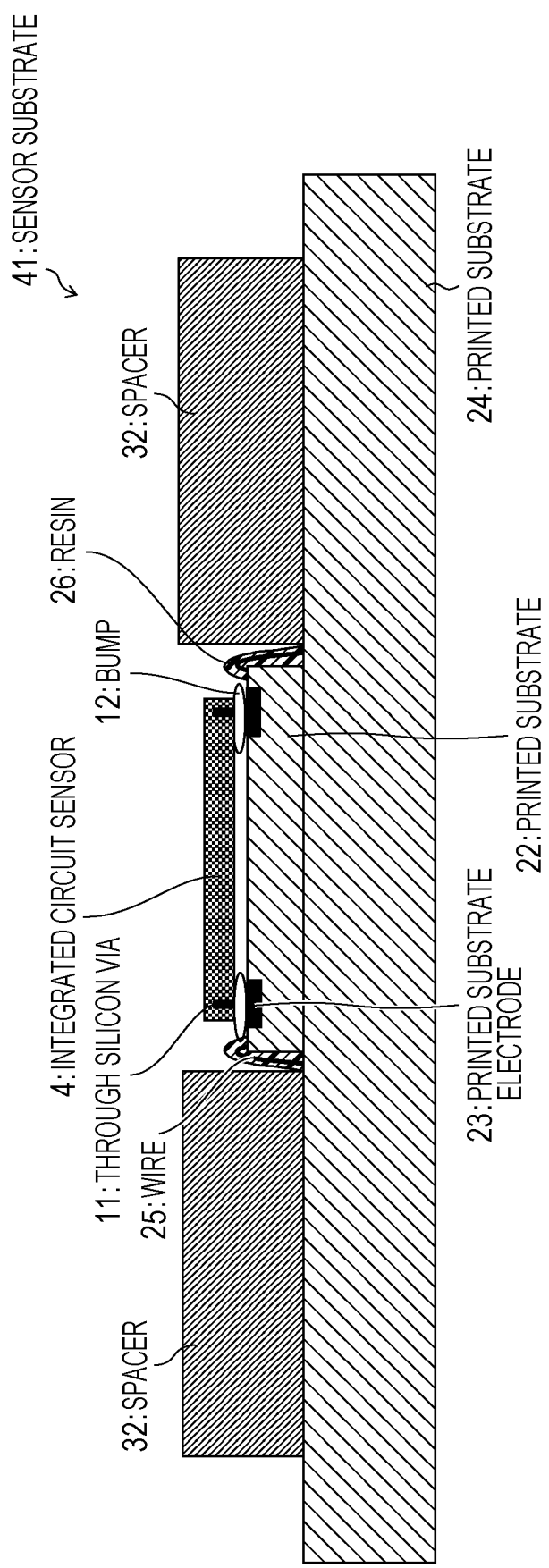
FIG. 6 is a view illustrating a schematic configuration of another sensor substrate according to Embodiment 3 of the invention, which includes the spacer the height of which is higher than that of the front surface of the integrated circuit sensor.

FIG. 6 is a view illustrating a schematic configuration of the sensor substrate 41 that includes the spacer 32 the height of which is higher than that of the front surface of the integrated circuit sensor 4.

The sensor substrate 41 illustrated in FIG. 6 is different from the sensor substrate 21 illustrated in FIG. 4 in that the spacer 32 is provided.

As illustrated, the spacer 32 that adjusts the pressure with which, when an inspection object is pressed against the printed substrate 24, the inspection object is in contact with the integrated circuit sensor 4 is provided around the integrated circuit sensor 4 and the printed substrate 22 on the printed substrate 24 in the sensor substrate 41.

In the present embodiment, the spacer 32 that adjusts the pressure with which the inspection object is in contact with the integrated circuit sensor 4 is provided so as to have the thickness by which the height thereof becomes higher than that of the front surface of the integrated circuit sensor 4, but is not limited thereto and may be provided so as to have the thickness by which the height thereof becomes almost the same as that of the front surface of the integrated circuit sensor 4.

When such a spacer 32 is provided, it is possible to realize the sensor substrate 41 that is able to receive a part of the pressure by the spacer 32 so that, in the case where the inspection object is pressed against the integrated circuit sensor 4, excessive pressure is not to be applied to the integrated circuit sensor 4.

Figure 7:
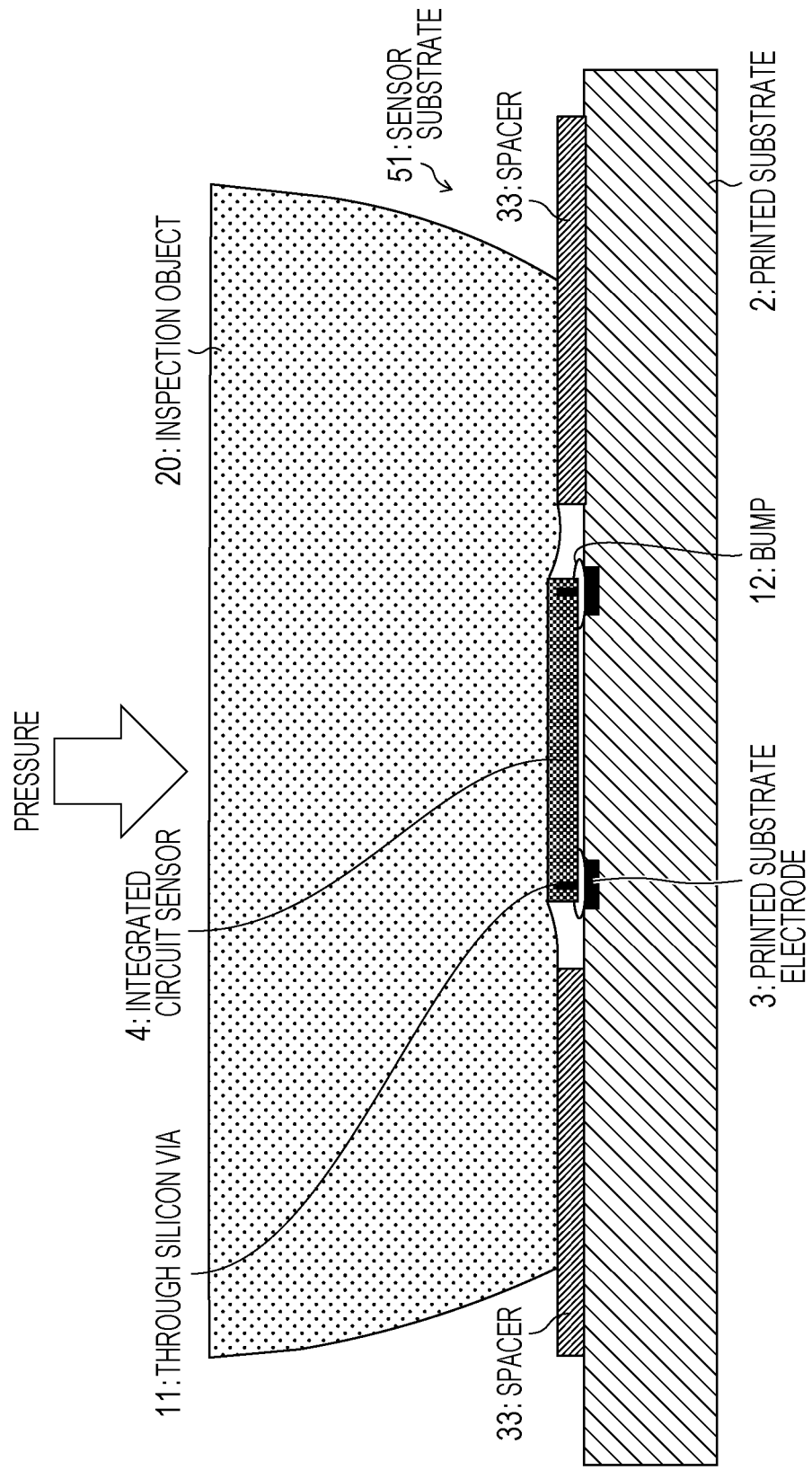
FIG. 7 is a view illustrating a schematic configuration of a sensor substrate according to Embodiment 3 of the invention, which includes a spacer a height of which is lower than that of the front surface of the integrated circuit sensor.

FIG. 7 is a view illustrating a schematic configuration of the sensor substrate 51 that includes the spacer 33 a height of which is lower than that of the front surface of the integrated circuit sensor 4.

The sensor substrate 51 illustrated in FIG. 7 is different from the sensor substrate 1 illustrated in FIG. 1 in that the spacer 33 is provided.

As illustrated, the spacer 33 that adjusts the pressure with which, when the inspection object 20 is pressed against the printed substrate 2, the inspection object 20 is in contact with the integrated circuit sensor 4 is provided around the integrated circuit sensor 4 on the printed substrate 2 in the sensor substrate 51.

In the present embodiment, the spacer 33 that adjusts the pressure with which the inspection object 20 is in contact with the integrated circuit sensor 4 is provided so as to have a thickness by which the height thereof becomes lower than that of the front surface of the integrated circuit sensor 4, but is not limited thereto and may be provided so as to have the thickness by which the height thereof becomes almost the same as that of the front surface of the integrated circuit sensor 4.

When such a spacer 33 is provided, it is possible to realize the sensor substrate 51 that is able to receive a part of the pressure by the spacer 33 so that, in the case where the inspection object 20 is pressed against the integrated circuit sensor 4, excessive pressure is not to be applied to the integrated circuit sensor 4.

Figure 8:
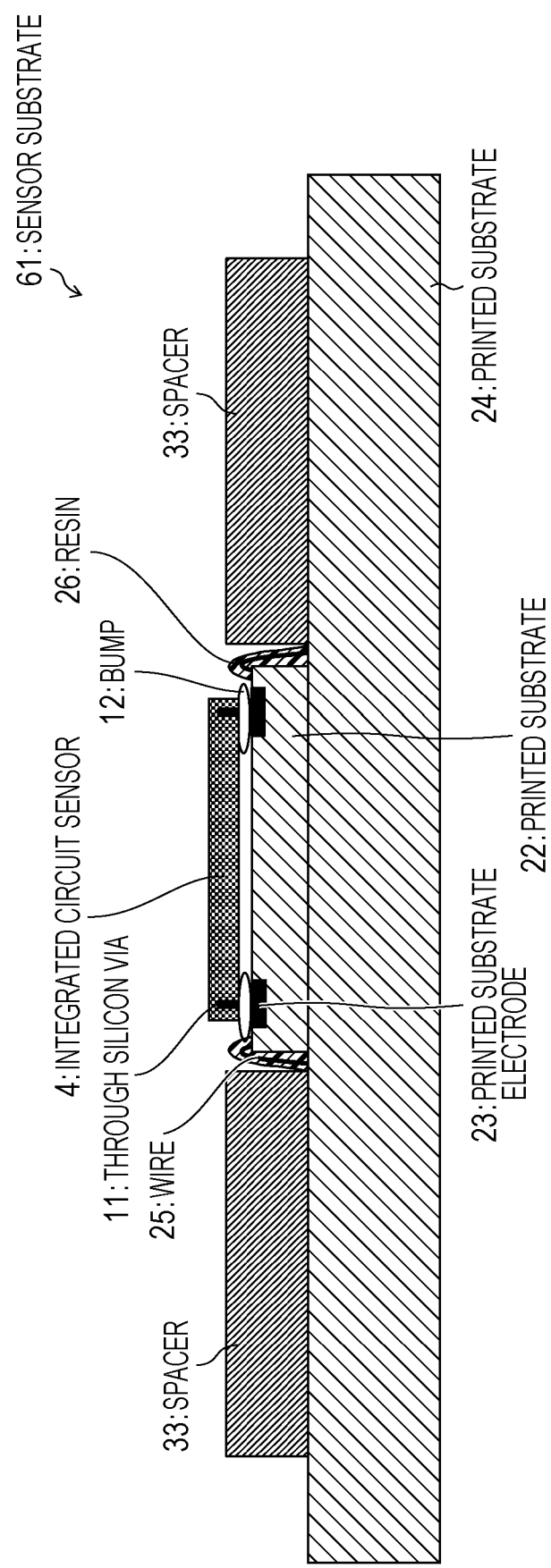
FIG. 8 is a view illustrating a schematic configuration of another sensor substrate according to Embodiment 3 of the invention, which includes the spacer the height of which is lower than that of the front surface of the integrated circuit sensor.

FIG. 8 is a view illustrating a schematic configuration of the sensor substrate 61 that includes the spacer 33 the height of which is lower than that of the front surface of the integrated circuit sensor 4.

The sensor substrate 61 illustrated in FIG. 8 is different from the sensor substrate 21 illustrated in FIG. 4 in that the spacer 33 is provided.

As illustrated, the spacer 33 that adjusts the pressure with which, when an inspection object is pressed against the printed substrate 24, the inspection object is in contact with the integrated circuit sensor 4 is provided around the integrated circuit sensor 4 and the printed substrate 22 on the printed substrate 24 in the sensor substrate 61.

In the present embodiment, the spacer 33 that adjusts the pressure with which the inspection object is in contact with the integrated circuit sensor 4 is provided so as to have the thickness by which the height thereof becomes lower than that of the front surface of the integrated circuit sensor 4, but is not limited thereto and may be provided so as to have the thickness by which the height thereof becomes almost the same as that of the front surface of the integrated circuit sensor 4.

When such a spacer 33 is provided, it is possible to realize the sensor substrate 61 that is able to receive a part of the pressure by the spacer 33 so that, in a case where the inspection object is pressed against the integrated circuit sensor 4, excessive pressure is not to be applied to the integrated circuit sensor 4.

By appropriately selecting a thickness, an area, an installation place of the spacer 32 or 33, it is possible to appropriately control the contact pressure of the inspection object and the integrated circuit sensor 4. It is preferable to provide the spacer 32 or 33 particularly in a case of desiring to maintain the contact pressure of the inspection object and the integrated circuit sensor 4 to be weak.

Note that, as long as the spacer 32 or 33 is able to receive a part of the pressure so that, in a case where an inspection object is pressed against the integrated circuit sensor 4, excessive pressure is not to be applied to the integrated circuit sensor 4, a material and the like of the spacer 32 or 33 are not particularly limited, but it is preferable to use one that has such a degree of solidity that a thickness thereof does not change when the spacer 32 or 33 is pressed by an inspection object.

Embodiment 4

Next, Embodiment 4 of the invention will be described on the basis of FIG. 9. A sensor substrate 71 of the present embodiment is different from those of Embodiments 1 to 3 in that a substrate on which the integrated circuit sensor 4 is mounted is a flexible substrate 72, and the other points are the same as what is described in Embodiments 1 to 3. For convenience of description, the same reference signs are assigned to members having the same functions as those of the members illustrated in the drawings of Embodiments 1 to 3, and description thereof is omitted.

Figure 9:
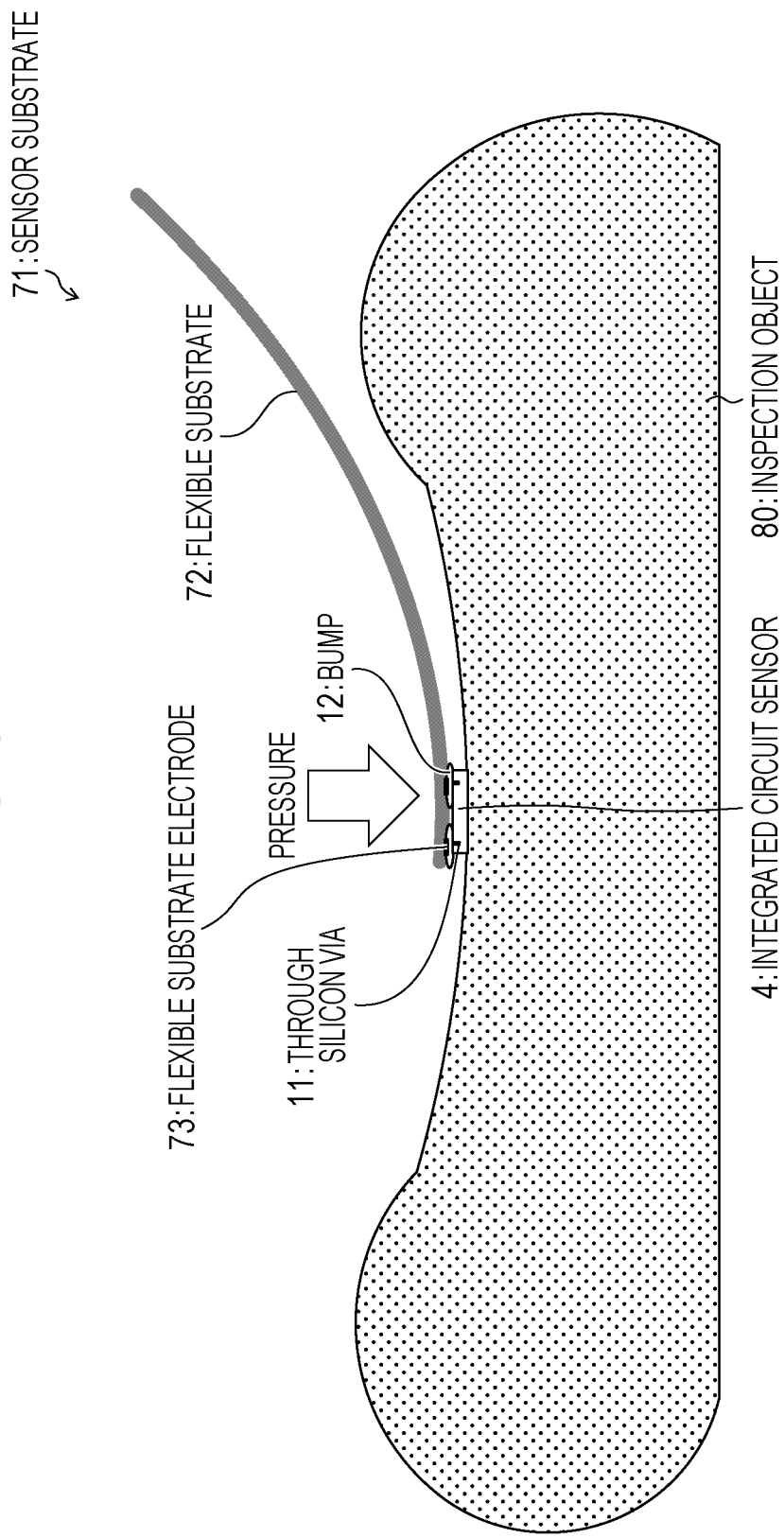
FIG. 9 is a view illustrating a schematic configuration of a sensor substrate according to Embodiment 4 of the invention, which includes a flexible substrate.

FIG. 9 is a view illustrating a schematic configuration of the sensor substrate 71 that includes the flexible substrate 72.

As illustrated, as the connection fixation member, the bump 12 is formed between the through silicon via 11 which is exposed from the rear surface of the integrated circuit sensor 4 and a flexible substrate electrode 73 of the flexible substrate 72.

In a case where an inspection object 80 has a convex-concave part, when a sensor substrate that includes a flat substrate which is not flexible is used, due to obstruction of a convex part of the inspection object 80, it is difficult to make the front surface of the integrated circuit sensor 4 and a concave part of the inspection object 80 contact with each other uniformly. However, since the flexible substrate 72 that is flexible is used in the sensor substrate 71 of the present embodiment, it is possible to facilitate making the front surface of the integrated circuit sensor 4 and the concave part of the inspection object 80 contact with each other uniformly.

Embodiment 5

Next, Embodiment 5 of the invention will be described on the basis of FIG. 10. A sensor substrate 81 of the present embodiment is different from those of Embodiments 1 to 4 in that a resin layer 82 which covers a periphery of the integrated circuit sensor 4 and in which a height of one end which is in contact with the integrated circuit sensor 4 is the same as that of the front surface of the integrated circuit sensor 4 and is the maximum height is formed, and the other points are the same as what is described in Embodiments 1 to 4. For convenience of description, the same reference signs are assigned to members having the same functions as those of the members illustrated in the drawings of Embodiments 1 to 4, and description thereof is omitted.

Figure 10:
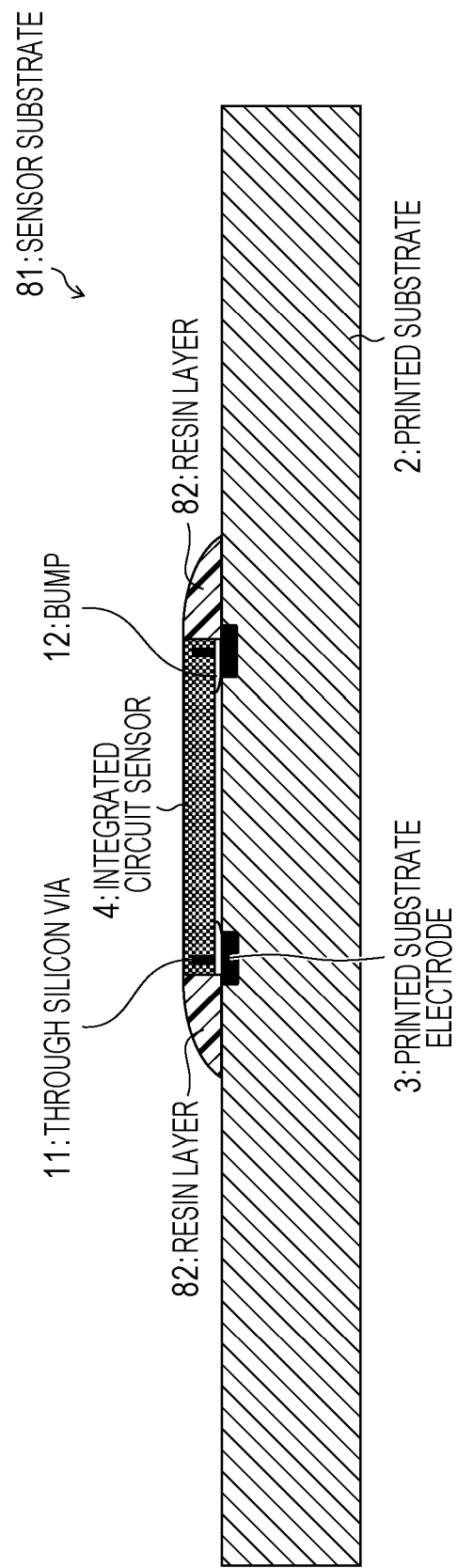
FIG. 10 is a view illustrating a schematic configuration of a sensor substrate according to Embodiment 5 of the invention.

FIG. 10 is a view illustrating a schematic configuration of the sensor substrate 81 that includes the resin layer 82.

The sensor substrate 81 illustrated in FIG. 10 is different from the sensor substrate 1 illustrated in FIG. 1 in that the resin layer 82 is provided.

As illustrated, the resin layer 82 which covers the periphery of the integrated circuit sensor 4 and in which the height of one end which is in contact with the integrated circuit sensor 4 is the same as that of the front surface of the integrated circuit sensor 4 and is the maximum height is formed on the printed substrate 2.

When such a resin layer 82 is provided, it is possible to prevent an inspection object such as a skin from being bit by an edge of the integrated circuit sensor 4, and to realize the sensor substrate 81 that enables, regardless of a type of the inspection object, the inspection object and the front surface of the integrated circuit sensor 4 to be in reliable contact with each other in a large region.

Embodiment 6

Next, Embodiment 6 of the invention will be described on the basis of FIG. 11. The present embodiment is different from Embodiments 1 to 5 in that the present embodiment relates to a sensor device 91 that includes the sensor substrate 1 and a case 92 (housing) to which a spring 93 serving as an elastic body is fixed, and the other points are the same as what is described in Embodiments 1 to 5. For convenience of description, the same reference signs are assigned to members having the same functions as those of the members illustrated in the drawings of Embodiments 1 to 5, and description thereof is omitted.

Figure 11:
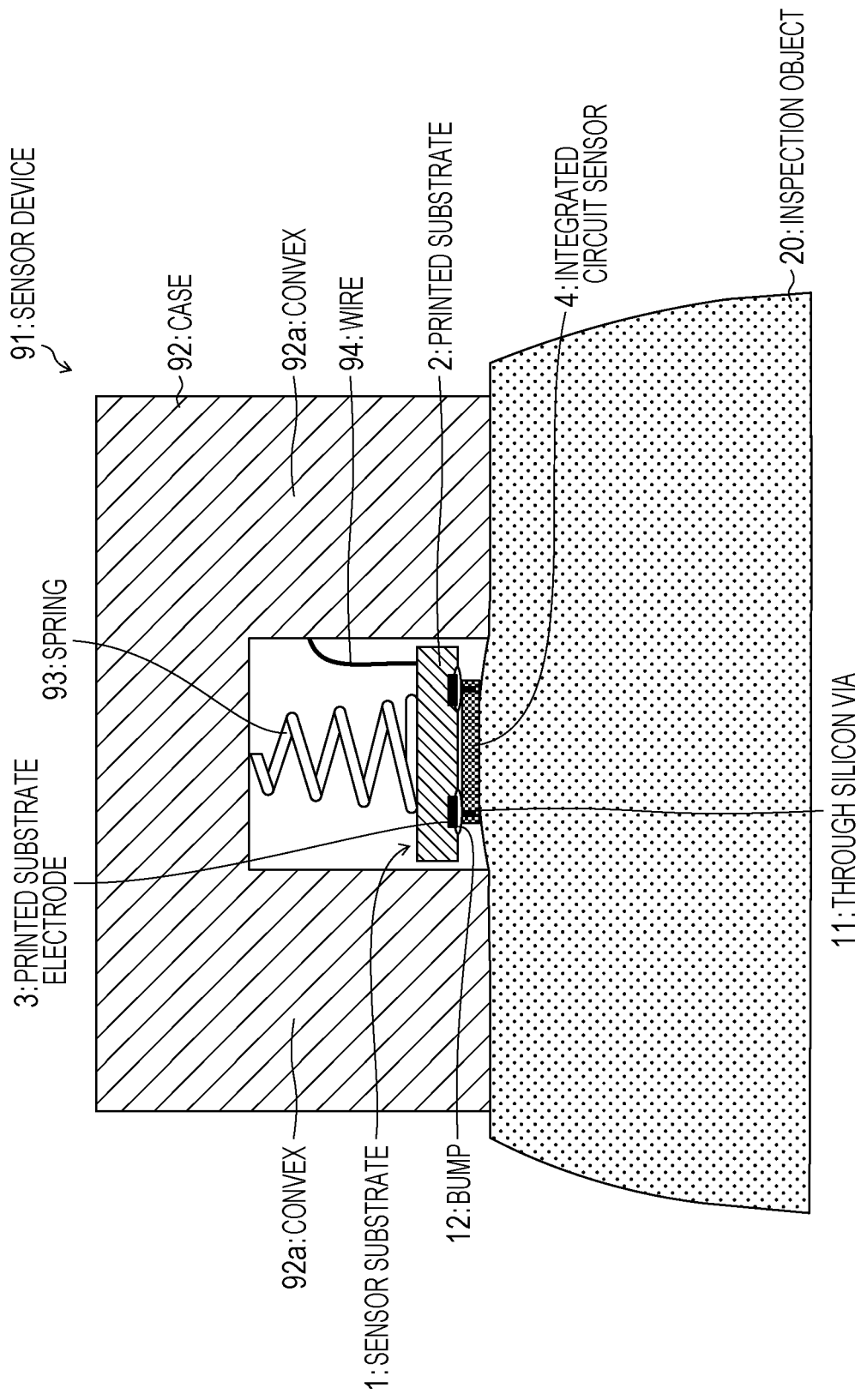
FIG. 11 is a view illustrating a schematic configuration of a sensor device according to Embodiment 6 of the invention.
Figure 12:
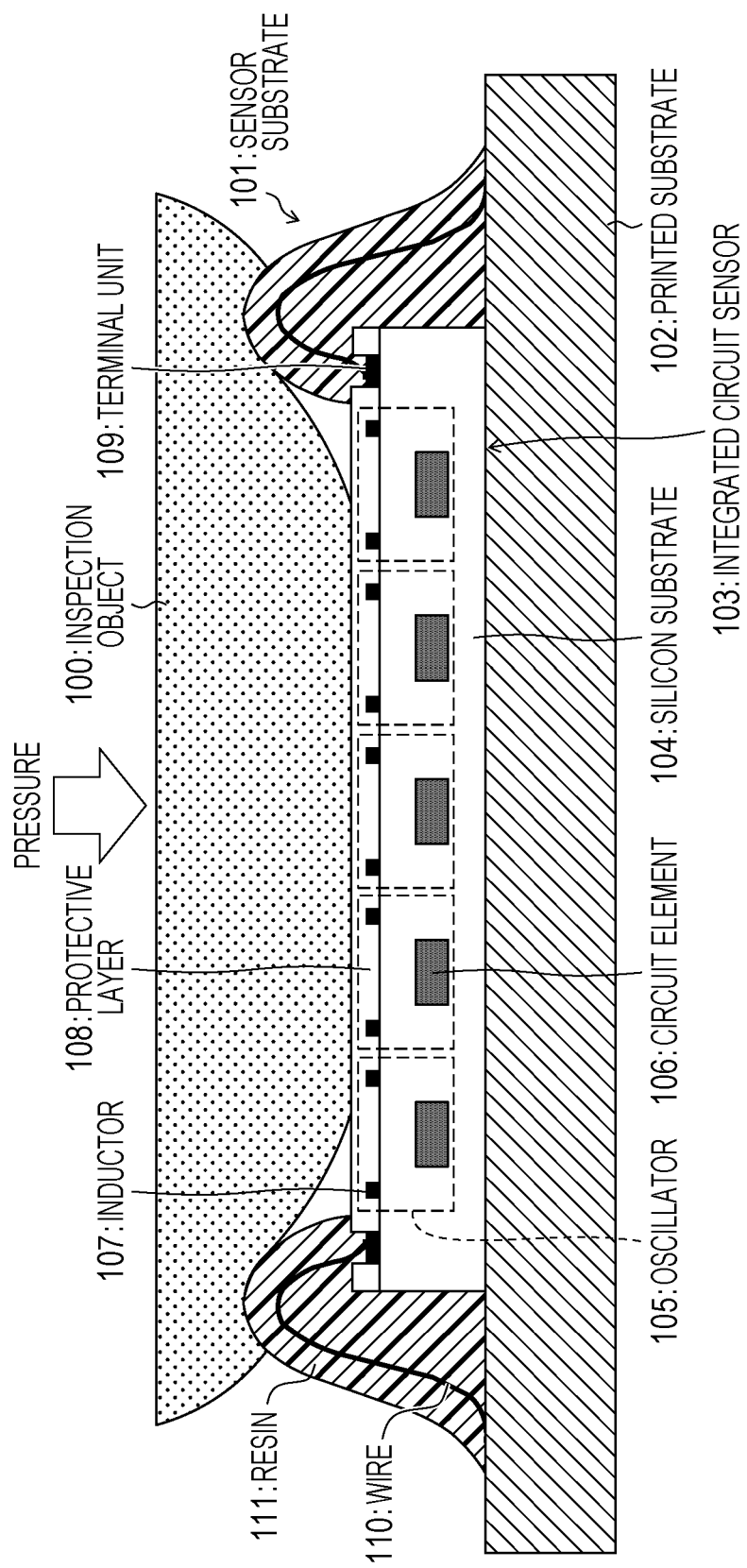
FIG. 12 is a view illustrating a schematic configuration of a conventional sensor substrate.
Figure 13:
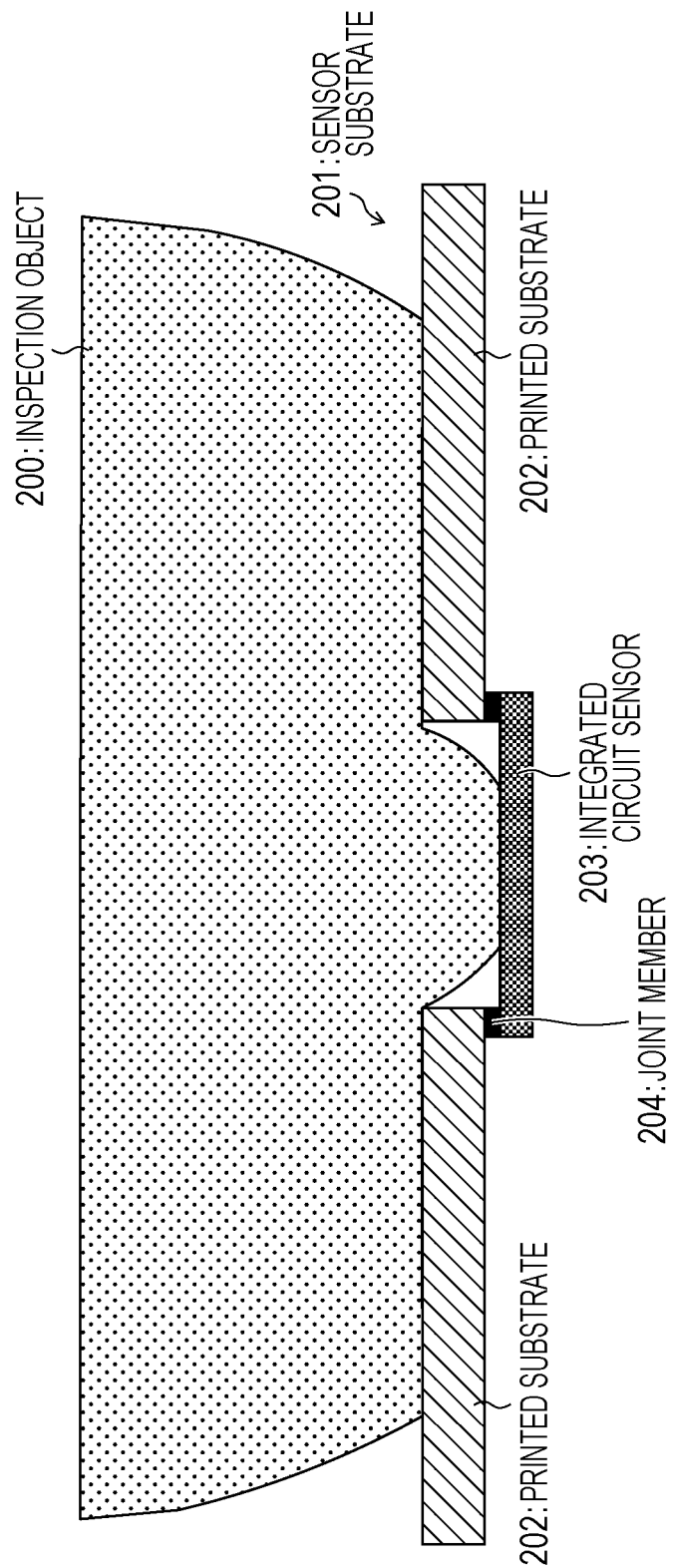
FIG. 13 is a view illustrating a schematic configuration of a sensor substrate disclosed in PTL 1.

FIG. 11 is a view illustrating a schematic configuration of the sensor device 91 that includes the sensor substrate 1 and the case 92 to which the spring 93 is fixed.

As illustrated, the sensor device 91 includes the sensor substrate 1 and the case 92 to which the spring 93 is fixed, and the spring 93 is connected to a surface of the sensor substrate 1, which is opposite to a surface on which the integrated circuit sensor 4 is provided.

In the sensor device 91, since the surface of the sensor substrate 1, which is opposite to the surface on which the integrated circuit sensor 4 is provided, and the case 92 are connected by the spring 93, it is possible to control the contact pressure of the inspection object 20 and the integrated circuit sensor 4 by a spring constant of the spring 92.

Moreover, the case 92 in the sensor device 91 is provided with a convex 92a that, when the inspection object 20 is pressed against the sensor substrate 1, adjusts the pressure with which the inspection object 20 is in contact with the integrated circuit sensor 4.

Accordingly, in the sensor device 91, since the convex 92a that adjusts the pressure with which the inspection object 20 is in contact with the integrated circuit sensor 4 is also provided, it is possible to receive a part of the pressure by the convex 92a so that, in the case where the inspection object 20 is pressed against the integrated circuit sensor 4, excessive pressure is not to be applied to the integrated circuit sensor 4.

Although description has been given in the present embodiment by taking, as an example, a case where the convex 92a that adjusts the pressure with which the inspection object 20 is in contact with the integrated circuit sensor 4 is formed integrally with the case 92, there is no limitation thereto, and the convex 92a and the case 92 may be formed individually.

Although, in the sensor device 91, the integrated circuit sensor 4 is electrically connected to the outside via the printed substrate 2, a through hole (through via) which is not illustrated and is provided in the printed substrate 2, and a wire 94, a method of connection with the outside is not limited thereto.

Although description has been given in the present embodiment by taking, as an example, a case where the spring 93 is used as the elastic body, a type of the elastic body is not particularly limited as long as being able to control the contact pressure of the inspection object 20 and the integrated circuit sensor 4.

CONCLUSION

An integrated circuit sensor in an aspect 1 of the invention is an integrated circuit sensor that detects a physical property of an inspection object by making the inspection object contact with a front surface or placing the inspection object in a vicinity of the front surface, in which a connection unit that electrically connects an inside of the integrated circuit sensor and an outside of the integrated circuit sensor is formed in the inside of the integrated circuit sensor so as to reach a rear surface of the integrated circuit sensor, which faces the front surface.

With the aforementioned configuration, since the connection unit that electrically connects the inside of the integrated circuit sensor and the outside of the integrated circuit sensor is formed in the inside of the integrated circuit sensor so as to reach the rear surface of the integrated circuit sensor, which faces the front surface, it is not necessary to electrically connect the inside of the integrated circuit sensor and the outside of the integrated circuit sensor by using the front surface of the integrated circuit sensor.

Accordingly, it is possible to realize an integrated circuit sensor that enables, regardless of a type of an inspection object, the inspection object and a front surface of the integrated circuit sensor to be in reliable contact with each other in a large region.

In the integrated circuit sensor in an aspect 2 of the invention, the connection unit may be a through electrode that passes through the inside of the integrated circuit sensor in a direction from the front surface to the rear surface, in the aspect 1.

With the aforementioned configuration, it is possible to realize an integrated circuit sensor that is able to electrically connect the inside of the integrated circuit sensor and the outside of the integrated circuit sensor by using the through electrode.

In the integrated circuit sensor in an aspect 3 of the invention, it is preferable that, in the aspect 1 or 2, the integrated circuit sensor includes an oscillation unit that includes a resonance circuit a resonance frequency of which changes in accordance with a physical property of the inspection object and an inductor in the resonance circuit is arranged on the front surface.

With the aforementioned configuration, it is possible to realize an integrated circuit sensor that detects a change in a physical property of an inspection object which is in contact with an inductor provided on a front surface of the integrated circuit sensor.

The integrated circuit sensor in an aspect 4 of the invention may include a detection unit that detects an oscillation frequency of the oscillation unit, in the aspect 3.

With the aforementioned configuration, since the integrated circuit sensor is provided with the detection unit that detects the oscillation frequency of the oscillation unit, an external detection unit is not required.

It is preferable that a sensor substrate in an aspect 5 of the invention includes the integrated circuit sensor according to any of the aspects 1 to 4 and a first substrate including an electrode or a wiring, and the electrode or the wiring of the first substrate and the connection unit are electrically connected via a connection fixation member.

With the aforementioned configuration, it is possible to realize a sensor substrate that enables, regardless of a type of an inspection object, the inspection object and a front surface of the integrated circuit sensor to be in reliable contact with each other in a large region.

In the sensor substrate in an aspect 6 of the invention, it is preferable that, in the aspect 5, the first substrate is fixed onto a second substrate by a fixation member, and the second substrate is larger than the first substrate so that the inspection object is in contact with the front surface of the integrated circuit sensor and the second substrate, in a case where the inspection object is pressed against the second substrate.

With the aforementioned configuration, by appropriately selecting a thickness of the first substrate, it is possible to appropriately adjust contact pressure of the inspection object and the front surface of the integrated circuit sensor.

In the sensor substrate in an aspect 7 of the invention, it is preferable that, in the aspect 5, a spacer that adjusts pressure with which, in a case where the inspection object is pressed against the first substrate, the inspection object is in contact with the integrated circuit sensor is provided around the integrated circuit sensor on the first substrate.

With the aforementioned configuration, since the spacer is provided, it is possible to realize the sensor substrate that is able to receive a part of the pressure by the spacer so that, in the case where the inspection object is pressed against the integrated circuit sensor, excessive pressure is not to be applied to the integrated circuit sensor.

In the sensor substrate in an aspect 8 of the invention, it is preferable that, in the aspect 6, a spacer that adjusts pressure with which, in a case where the inspection object is pressed against the second substrate, the inspection object is in contact with the integrated circuit sensor is provided around the integrated circuit sensor and the first substrate on the second substrate.

With the aforementioned configuration, since the spacer is provided, it is possible to realize the sensor substrate that is able to receive a part of the pressure by the spacer so that, in the case where the inspection object is pressed against the integrated circuit sensor, excessive pressure is not to be applied to the integrated circuit sensor.

In the sensor substrate in an aspect 9 of the invention, it is preferable that, in the aspect 5, the first substrate is a flexible substrate.

In a case where an inspection object has a convex-concave part, when a sensor substrate that includes a flat substrate which is not flexible is used, due to obstruction of a convex part of the inspection object, it is difficult to make the front surface of the integrated circuit sensor and a concave part of the inspection object contact with each other uniformly. However, with the aforementioned configuration, since the flexible substrate that is flexible is used, it is possible to facilitate making the front surface of the integrated circuit sensor and the concave part of the inspection object contact with each other uniformly.

In the sensor substrate in an aspect 10 of the invention, it is preferable that, in any of the aspects 5 to 9, a resin layer which covers a periphery of the integrated circuit sensor and in which a height of one end which is in contact with the integrated circuit sensor is the same as that of the front surface of the integrated circuit sensor and is a maximum height is formed on the first substrate.

With the aforementioned configuration, by including the resin layer, it is possible to prevent an inspection object such as a skin from being bit by an edge of the integrated circuit sensor, and to realize the sensor substrate that enables, regardless of a type of the inspection object, the inspection object and the front surface of the integrated circuit sensor to be in reliable contact with each other in a large region.

It is preferable that a sensor device in an aspect 11 of the invention includes the sensor substrate according to any of the aspects 5 to 10 and a housing to which an elastic body is fixed, and the elastic body is connected to a surface of the sensor substrate, which is opposite to a surface on which the integrated circuit sensor is provided.

With the aforementioned configuration, it is possible to control contact pressure of the inspection object and the integrated circuit sensor by an elastic constant of the elastic body.

In the sensor device in an aspect 12 of the invention, it is preferable that, in the aspect 11, a convex that, in a case where the inspection object is pressed against the sensor substrate, adjusts the pressure with which the inspection object is in contact with the integrated circuit sensor is provided.

With the aforementioned configuration, since the convex that adjusts the pressure with which the inspection object is in contact with the integrated circuit sensor is provided, it is possible to receive a part of the pressure by the convex so that, in the case where the inspection object is pressed against the integrated circuit sensor, excessive pressure is not to be applied to the integrated circuit sensor.

Note that, the invention is not limited to each of the embodiments described above and may be modified in various manners within the scope of the claims, and an embodiment achieved by appropriately combining technical means disclosed in different embodiments is also encompassed in the technical scope of the invention.

INDUSTRIAL APPLICABILITY

The invention is able to be suitably used for an integrated circuit sensor, a sensor substrate, and a sensor device.

REFERENCE SIGNS LIST 1 sensor substrate
2 printed substrate (first substrate)
3 printed substrate electrode (electrode)
4 integrated circuit sensor
5 silicon substrate (semiconductor substrate)
6 oscillator (oscillation unit)
7 circuit element
8 inductor
9 protective layer
10 metal wiring
11 through silicon via (connection unit)
12 bump (connection fixation member)
13 frequency readout circuit (detection unit)
14 current source
15 capacitor
16 resonator (resonance circuit)
17 differential circuit
20 inspection object
21 sensor substrate
22 printed substrate (first substrate)
23 printed substrate electrode (electrode)
24 printed substrate (second substrate)
25 wire
26 resin (fixation member)
31 sensor substrate
32 spacer
33 spacer
41 sensor substrate
51 sensor substrate
61 sensor substrate
71 sensor substrate
72 flexible substrate
73 flexible substrate electrode
80 inspection object
81 sensor substrate
82 resin layer
91 sensor device
92 case (housing)
92a convex
93 spring (elastic body)
94 wire
M1 transistor
M2 transistor

The invention claimed is:

1. An integrated circuit sensor that detects a physical property of an inspection object by making the inspection object contact with a front surface or placing the inspection object in a vicinity of the front surface, wherein
the integrated circuit sensor comprises an oscillator circuit including a resonance circuit including an inductor therein,
the inductor is provided in the vicinity of the front surface of the integrated circuit sensor,
frequency of the oscillator circuit changes based on changes in the physical property of the inspection object approaching the inductor, and
a connection unit that electrically connects a circuit element and an outside of the integrated circuit sensor is formed in the inside of the integrated circuit sensor to reach a rear surface of the integrated circuit sensor, which faces the front surface,
wherein the integrated circuit further comprises:
a differential circuit comprising at least one pair of transistors cross-coupled to each other, and
an inductor and a capacitor connected in parallel between a plurality of differential outputs of the differential circuit.

2. A sensor substrate, comprising the integrated circuit sensor according to claim 1 and a first substrate including an electrode or a wiring, wherein
the electrode or the wiring of the first substrate and the connection unit are electrically connected via a connection fixation member,
the first substrate is fixed onto a second substrate by a fixation member, and
the second substrate is larger than the first substrate in such a way that the inspection object is in contact with the front surface of the integrated circuit sensor and the second substrate, in a case where the inspection object is pressed against the second substrate.

3. A sensor substrate, comprising the integrated circuit sensor according to claim 1 and a first substrate including an electrode or a wiring, wherein
the electrode or the wiring of the first substrate and the connection unit are electrically connected via a connection fixation member, and
a spacer that adjusts pressure with which, in a case where the inspection object is pressed against the first substrate, the inspection object is in contact with the integrated circuit sensor is provided around the integrated circuit sensor on the first substrate.

4. A sensor substrate, comprising the integrated circuit sensor according to claim 1 and a first substrate including an electrode or a wiring, wherein
the electrode or the wiring of the first substrate and the connection unit are electrically connected via a connection fixation member, and
the first substrate is a flexible substrate.

5. A sensor substrate, comprising the integrated circuit sensor according to claim 1 and a first substrate including an electrode or a wiring, wherein
the electrode or the wiring of the first substrate and the connection unit are electrically connected via a connection fixation member, and
a resin layer, which covers a periphery of the integrated circuit sensor and in which a height of one end in contact with the integrated circuit sensor is same as that of the front surface of the integrated circuit sensor and is a maximum height, is formed on the first substrate.

6. A sensor substrate, comprising the integrated circuit sensor according to claim 1 and a first substrate including an electrode or a wiring, wherein
the circuit element detects the physical property of the inspection object using the resonance circuit provided with the oscillator circuit.

7. The integrated circuit sensor according to claim 1 further comprising a read circuit provided outside the integrated circuit sensor, wherein the frequency of the oscillator circuit is read from the integrated circuit sensor using the connection unit.

* * * * *